(12) United States Patent
Zocchi et al.

(10) Patent No.: US 8,390,785 B2
(45) Date of Patent: Mar. 5, 2013

(54) COLLECTOR OPTICAL SYSTEM

(75) Inventors: Fabio E. Zocchi, Parini (IT); Pietro Binda, Parini (IT); Enrico Benedetti, Parini (IT)

(73) Assignee: Media Lario, S. R. L., Bosisio Parini (LC) (IT)

( * ) Notice: Subject to any disclaimer, the term of this patent is extended or adjusted under 35 U.S.C. 154(b) by 827 days.

(21) Appl. No.: 12/441,343

(22) PCT Filed: Sep. 3, 2007

(86) PCT No.: PCT/EP2007/007674
§ 371 (c)(1),
(2), (4) Date: Sep. 21, 2009

(87) PCT Pub. No.: WO2008/031514
PCT Pub. Date: Mar. 20, 2008

(65) Prior Publication Data
US 2010/0096557 A1 Apr. 22, 2010

(30) Foreign Application Priority Data
Sep. 15, 2006 (EP) .................................. 06425634

(51) Int. Cl.
G03B 27/54 (2006.01)
G03B 27/42 (2006.01)

(52) U.S. Cl. .......................................... 355/67; 355/53
(58) Field of Classification Search .................. 355/53, 355/67–71; 359/350, 359; 250/504 R
See application file for complete search history.

(56) References Cited

U.S. PATENT DOCUMENTS

| | | | | |
|---|---|---|---|---|
| 5,067,053 A * | 11/1991 | Akizuki | ........................ | 362/518 |
| 6,859,259 B2 * | 2/2005 | Bakker et al. | ................... | 355/53 |
| 7,765,989 B2 * | 8/2010 | Maruyama | .................... | 123/508 |
| 7,781,750 B2 * | 8/2010 | Singer | ....................... | 250/504 R |

FOREIGN PATENT DOCUMENTS

| | | |
|---|---|---|
| EP | 1 225 481 A2 | 7/2002 |
| WO | WO 03/014833 A2 | 2/2003 |
| WO | WO 2004/095140 A2 | 11/2004 |
| WO | WO 2006/050891 A2 | 5/2006 |

OTHER PUBLICATIONS

Foreign Search Report dated Mar. 13, 2008, International filing date Mar. 9, 2007, International Application No. PCT/EP2007/007674, Applicant: Media Lario s.r.l., (6) pages.
Fabio E. Zocchi, et al., Comparison of optical performances of alternative grazing incidence collector designs for EUV lithography, Emerging Lithographic Technologies XI, edited by Michael J. Lercel, Proc. of SPIE vol. 6517, 65173M, (2007), (11) pages.

* cited by examiner

*Primary Examiner* — Hung Henry Nguyen
(74) *Attorney, Agent, or Firm* — Opticus IP Law PLLC

(57) ABSTRACT

A collector optical system is provided in which radiation is collected from a radiation source and directed to an image focus. The collector optical system includes one or more mirrors, with each mirror being symmetric about an optical axis extending through the radiation source and each mirror having at least first and second reflective surfaces. The first and second reflective surfaces have a common focus, such that radiation from the source undergoes successive grazing incidence reflections at the first and second reflective surface and wherein the common focus is transversely offset by a predetermined distance Δr with respect to the optical axis.

14 Claims, 5 Drawing Sheets

COLLECTOR OPTICAL SYSTEM

CROSS REFERENCE TO RELATED APPLICATIONS

This application claims priority to and the benefit of the filing date of PCT Application No. PCT/EP2007/007674, filed Sep. 3, 2007 and European Patent Application No. EP 06 425 634.0, filed Sep. 15, 2006, both of which are each hereby incorporated by reference in their entirety.

BACKGROUND OF THE INVENTION

The subject matter disclosed herein relates to multi-reflection optical systems, and more particularly to collector optics for lithography and imaging applications, and to their fabrication.

A well known optical design for X-ray applications is the type I Wolter telescope. The optical configuration of type I Wolter telescopes consists of nested double-reflection mirrors operating at grazing incidence.

More recently, a variation of the type I Wolter design already proposed for other applications, in which the parabolic surface is replaced by an ellipsoid, has found application for collecting the radiation at 13.5 nm emitted from a small hot plasma used as a source in Extreme Ultra-Violet (EUV) microlithography, currently considered a promising technology in the semiconductor industry for the next generation lithographic tools. Here, there is a performance requirement to provide a near constant radiation energy density or flux across an illuminated silicon wafer target at which an image is formed. The hot plasma in EUV lithography source is generated by an electric discharge (Discharge Produced Plasma or DPP source) or by a laser beam (Laser Produced Plasma or LPP source) on a target consisting of Lithium, Xenon, or Tin, the latter apparently being the most promising. The emission from the source is roughly isotropic and, in current DPP sources, is limited by the discharge electrodes to an angle of about 600 or more from the optical axis. EUV lithography systems are disclosed, for example, in US2004/0265712A1, US2005/0016679A1 and US2005101 55624A1.

A simplified block diagram of a known EUV lithography system is shown in FIG. 1. The ultra-violet source 102 is normally a hot plasma, the emission of which is collected by the collector 104 and delivered to an illuminator 106. The latter illuminates a mask or reticle 108 with the pattern to be transferred to the wafer 110. The image of the mask or reticle is projected onto the wafer 110 by the projection optics box 112.

Presently, the most promising optical design for collectors 104 is based on nested Wolter I configuration, as illustrated in FIG. 2. Each mirror 200 is a thin shell consisting of two sections (surfaces) 202, 204: the first one 202, closer to the source 102 is a hyperboloid whereas the second 204 is an ellipsoid, both with rotational symmetry, with a focus in common.

The light source 102 is placed in the focus of the hyperboloid different from the common focus. The light from the source 102 is collected by the hyperbolic section 202, reflected onto the elliptic section 204 and then concentrated to the focus of the ellipsoid, different from the common focus, and known as intermediate focus (IF) 206.

From an optical point of view, the performance of the collector 102 is mainly characterized by the collection efficiency and the far field intensity distribution. The collection efficiency is the ratio between the light intensity at intermediate focus 206 and the power emitted by the source 102 into half a sphere. The collection efficiency is related to the geometry of the collector 104, to the reflectivity of each mirror 200, to the spatial and angular distribution of the source 102, to the optical specifications of the illuminator. The far field intensity distribution is the 2D spatial distribution of the light intensity beyond the intermediate focus 206 at distances that depends on the illuminator design, but that are normally of the same order of magnitude as the distance between the source 102 and intermediate focus 206.

The collector 104 is normally used in conjunction with a hot plasma source 102. Thus, the thermal load from UV radiation on the collector 104 is very high and a proper cooling system is required. The cooling system is positioned on the back surface of each mirror 200 in the shadow area that is present on the back side of both the elliptical section 204 and the hyperbolic section 202 (see FIG. 2).

Referring to FIG. 3, in the design of a Wolter I mirror the hyperbolic 202 and the elliptical section 204 has a focus in common 304 that lays on the optical axis 302 (i.e. the line through the source focus 102 and the intermediate focus 206). This condition introduces a constraint in the design of the mirror 200, 200' with the consequence that the designer has one degree of freedom (one real parameter, corresponding to the position of the common focus 304 on the optical axis 302) for each mirror. The resulting total number of degrees of freedom is further reduced by the system specification for the whole collector 104, by manufacturing requirements, etc. It is then possible that, in order to satisfy all the requirements and boundary conditions, the design of the collector is not fully optimized in terms of optical performance.

By way of example, FIG. 4 and Table A.1 show the optical layout and prescriptions of a Wolter I collector 104 designed for the following specifications:

Distance between source 102 and IF 206: 1500 mm
Maximum numerical aperture at IF: 0.139 (8°)
Minimum distance between source 102 and optics (104): 110 mm
Mirror thickness: 2 mm—Number of nested mirrors 200, 200': 7

TABLE A.1

| | Reference Wolter design | | | | | | |
|---|---|---|---|---|---|---|---|
| | Hyperbola | | Ellipse | | Mirror radii [mm] | | |
| Mirror # | Conic Constant | Radius of curvature [mm] | Conic Constant | Radius of curvature [mm] | Maximum | Ellipse-hyperbola joint | Minimum |
| 1 | −1.01019385 | 2.1365 | −0.99852911 | 1.4137 | 36.2242 | 34.3239 | 24.6418 |
| 2 | −1.01738536 | 3.6308 | −0.99755671 | 2.3494 | 46.7105 | 44.1731 | 31.5202 |
| 3 | −1.02914859 | 6.0526 | −0.99599879 | 3.8505 | 59.8238 | 56.4726 | 40.0528 |
| 4 | −1.04841826 | 9.9610 | −0.99350491 | 6.2582 | 76.3193 | 71.9129 | 50.6512 |

TABLE A.1-continued

| | Reference Wolter design | | | | | | |
|---|---|---|---|---|---|---|---|
| | Hyperbola | | Ellipse | | Mirror radii [mm] | | |
| Mirror # | Conic Constant | Radius of curvature [mm] | Conic Constant | Radius of curvature [mm] | Maximum | Ellipse-hyperbola joint | Minimum |
| 5 | −1.08035217 | 16.2846 | −0.98949472 | 10.1427 | 97.2646 | 91.4560 | 63.8362 |
| 6 | −1.13469930 | 26.6371 | −0.98296834 | 16.4983 | 124.2702 | 116.5224 | 80.2740 |
| 7 | −1.23207212 | 44.0419 | −0.97209459 | 27.1823 | 159.9860 | 149.3855 | 100.8206 |

The design of FIG. 4 collects the light from the source 102 up to an angle of 55.5°. The collection efficiency of the collector 104 shown in FIG. 4 calculated for a point source and assuming a Ruthenium coating with theoretical reflectivity is 27.7% with respect to $2\pi$ sr emission.

Where comparative performance data are given herein for collector designs, these are relative to the design of FIG. 4.

FIG. 5 shows the grazing incidence angle on both the hyperbolic section 202 and elliptical section 204 as a function of the emission angle for the Wolter I collector 104 of FIG. 4. It can be noted that the grazing incidence angle on the hyperbolic section 202 is always greater than the grazing incidence angle on the elliptical section 204. The consequence of this difference is a decrease of the efficiency of the collector 104 since the maximum optical transmission is achieved when the two angles are equal.

The purpose of the collector 104 in EUV sources is to transfer the largest possible amount of in-band power emitted from the plasma to the next optical stage, the illuminator 106, of the lithographic tool 100 (see FIG. 1), with the collector efficiency being as defined hereinabove. For a given maximum collection angle on the source side, the collector efficiency is mainly determined by collected angle and by the reflectivity of the coating on the optical surface of the mirrors.

A problem with known systems is that that collector efficiency is significantly lower than it might be since the reflectivity of the coating is not exploited in the most efficient way. Any improvement in the collector efficiency is highly desirable.

A further problem is that, with the collector efficiencies available, there is imposed the need to develop extremely powerful sources, and to have high optical quality and stability in the collector.

A further problem is that the number of degrees of freedom in the design of each mirror is limited.

A further problem is that the collector lifetime may be relatively short due to exposure to extremely powerful sources.

BRIEF DESCRIPTION OF THE INVENTION

According to one aspect of various embodiments of the present invention there is provided a collector optical system for Extreme Ultra-Violet (EUV) lithography, in which radiation is collected from a radiation source and directed to an image focus. The collector optical system includes one or more mirrors, with each mirror being symmetric about an optical axis extending through the radiation source and each mirror having at least first and second reflective surfaces. The first and second reflective surfaces have a common focus, whereby, in use, radiation from the source undergoes successive grazing incidence reflections at the first and second reflective surface; and wherein the common focus is transversely offset by a predetermined distance $\Delta r$ with respect to the optical axis.

BRIEF DESCRIPTION OF THE DRAWINGS

Embodiments of the invention will now be described in detail, by way of example, with reference to the accompanying drawings, in which.

In the description and drawings, like numerals are used to designate like elements. Unless indicated otherwise, any individual design features and components may be used in combination with any other design features and components disclosed herein.

DETAILED DESCRIPTION OF THE INVENTION

Figure 1:
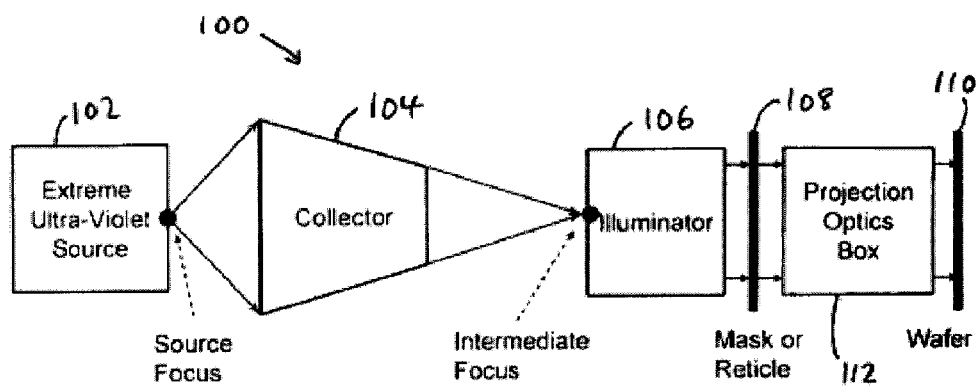
FIG. 1 shows an example of a known EUV lithography system.
Figure 2:
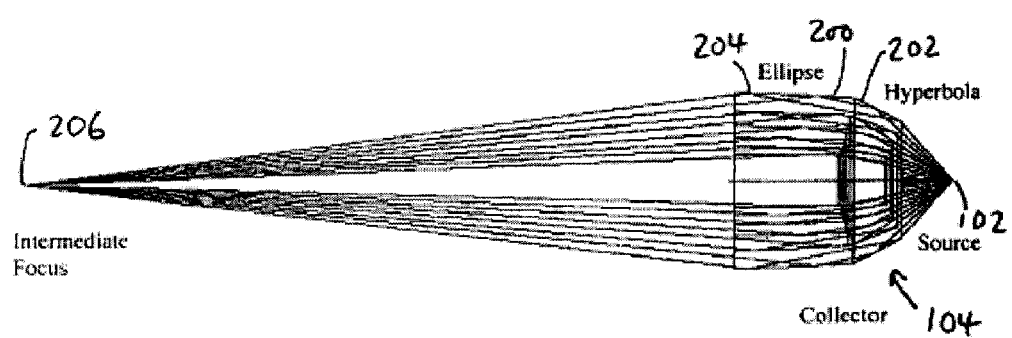
FIG. 2 shows a ray diagram for the collector optics of the EUV lithography system of FIG. 1.
Figure 3:
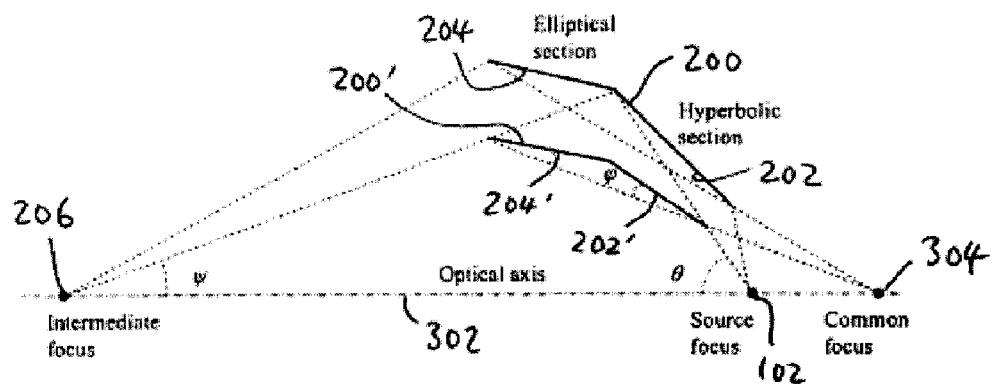
FIG. 3 depicts in more detail a partial optical layout of a known type I Wolter nested collector (reference design) for EUV plasma sources.
Figure 4:
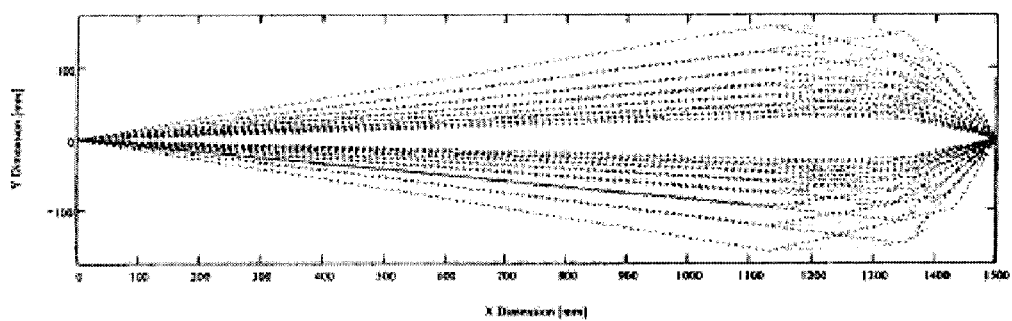
FIG. 4 illustrates a ray diagram for the collector of FIG. 3.
Figure 5:
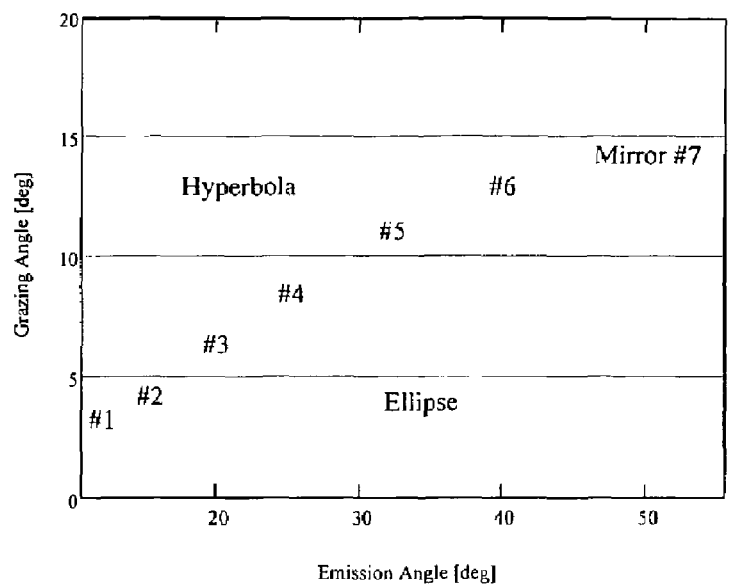
FIG. 5 shows grazing incidence angle on both the hyperbolic and elliptical sections as a function of the emission angle, for the collector of FIG. 4.

In the illustrations of optical elements or systems herein, unless indicated otherwise, cylindrical symmetry around the optical axis is assumed; and references to an "image focus" are references to an image focus or an intermediate focus.

The design and construction of the collector 104 according to various embodiments of the invention is as set out above in relation to FIGS. 1 to 5, except as described hereinafter.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments of the invention provide a collector optical system having one or more mirrors being symmetrical about an optical axis extending through a radiation source. Each mirror has at least first and second reflective surfaces with a common focus and the common focus is transversely offset by a predetermined distance Δr with respect to the optical axis. In this context, "transversely offset by a predetermined distance Δr" means that the common focus is spaced apart from the nearest point on the optical axis by the predetermined distance Δr. The predetermined distance Δr is such that an angle α is made between the optical axis and an off-axis or skew line 201 through the image focus (intermediate focus) and the off-axis common focus (see FIG. 6). The source focus 102 and common focus 304 are connected by an imaginary line 203, as described below. As will be apparent to persons skilled in the art, this angle α may have any suitable value sufficient to obtain collector efficiency improvement/optimization. For example, the angle α may be in the range from about 0.01 mrad to 1000 mrad. In some embodiments, the angle α lies in the range from about 0.1 mrad to about 100 mrad. In other embodiments, the angle α lies in the range from about 1 mrad to about 100 mrad. In still other embodiments, the angle α lies in the range from about 10 mrad to about 45 mrad.

Each mirror in some embodiments is formed as an electroformed monolithic component, and wherein the first and second reflective surfaces are each provided on a respective one of two contiguous sections of the mirror. The first reflective surface, closest to the source, may have a hyperbolic shape. The second reflective surface, furthest from the source, may be obtained by rotating an elliptical profile around an axis that is not an axis of symmetry of the ellipse. A plurality of mirrors may be provided in nested configuration. In certain embodiments, two of more of the mirrors each have a different geometry. The mirrors in some embodiments are as specified in Tables B.1 and B.2 set out hereinbelow. In other embodiments, the mirrors are as specified in Tables C.1 and C.2 set out hereinbelow.

One or more of the mirrors in some embodiments may have mounted thereon, for example on the rear side thereof, one or more devices for the thermal management of the mirror, for example cooling lines, Peltier cells and temperature sensors. One or more of the mirrors in some embodiments may have mounted thereon, for example on the rear side thereof, one or more devices for the mitigation of debris from the source, for example erosion detectors, solenoids and RF sources.

According to another aspect of the various embodiments of the present invention there is provided an EUV lithography system having: a radiation source, for example an LPP source, with the collector optical system according to the various embodiments described herein, an optical condenser and a reflective mask.

According to another aspect of various embodiments of the present invention there is provided an EUV or X-ray imaging system, having: the imaging optical system according to the foregoing paragraph and an imaging device, for example a CCD array, disposed at the image focus.

Various embodiments of the invention may provide a collection efficiency that is improved and/or maximized.

Various embodiments of the invention also may relax the effort in developing extremely powerful sources, improving the optical quality and stability of the collector output and increasing the collector lifetime.

Various embodiments of the invention also may increase the number of degrees of freedom in the design of each mirror in order achieve higher optical performance. The design of each two-section mirror according to various embodiments of the present invention has two degrees of freedom instead of one: the position of the projection of the common focus on the optical axis and the offset of the common focus from the optical axis.

Figure 6:
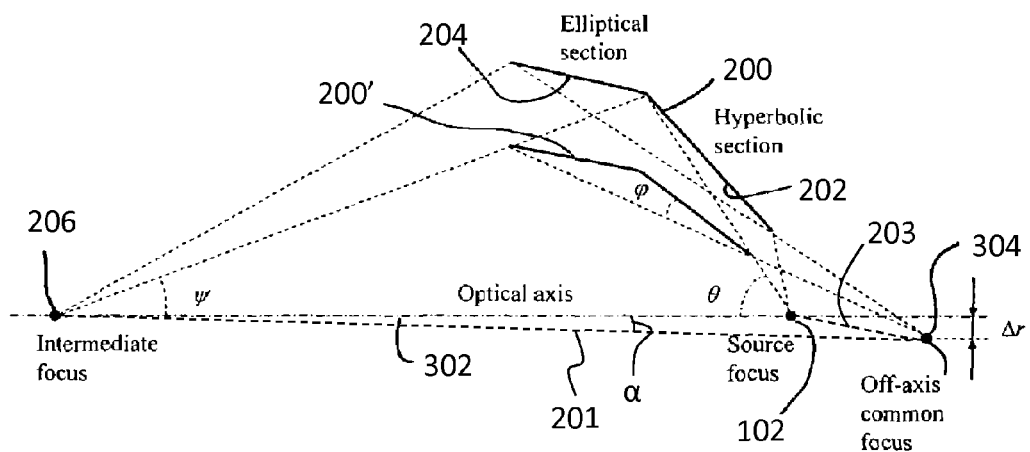
FIG. 6 shows the partial optical layout of a nested collector according to various embodiments of the invention.

FIG. 6 shows the cross-section of the partial optical layout of a nested collector according to various embodiments of the invention. The optical axis 302 is the line passing through the source focus 102, which is one of the two foci of the hyperbolic cross section, and the intermediate focus 206, which is one of the two foci of the elliptical cross section. The hyperbolic cross section and the elliptical cross section have in common their second focus 304. The common focus 304 (of the hyperbolic 202 and elliptical 204 cross section shown in FIG. 6) is offset by a distance Δr with respect to the optical axis 302 (i.e., is off-axis). The aforementioned off-axis line 201 is drawn through intermediate focus 206 and the off-axis common focus 304. Off-axis line 201 defines the aforementioned angle α with respect to the optical axis 204 and is referred to herein as an "off-axis" line because it does not travel on or parallel to the optical axis 204. The full mirror 200, 200' is obtained by rotating the cross section of FIGS. 6 through 360° about the optical axis 302. In this process the common focus 304 describes a circle of radius Δr around the optical axis 302. The surface of revolution obtained by the rotation of the cross section of FIG. 6 about the optical axis 302 does not consist of a hyperboloid and an ellipsoid, even if this is so for the cross section that was used to start with. More specifically, referring to FIG. 6, the process is as follows. First define the optical axis 302 as the line passing through the source focus 102 and intermediate focus 206. Then define a common focus 304 at a distance Δr from the optical axis 302. Then define an ellipse 204 having as its axis the line 201 through the intermediate focus 206 and the common focus 304. This defines the elliptic cross section 204 with foci 206 and 304. Then define an hyperbola 202 having as its axis a line 203 through the source focus 102 and the common focus 304. This defines the hyperbolic cross section 202 with foci 102 and 304. The two cross sections 204 and 200 are then rotated around the optical axis 302. The resulting three-dimensional surfaces are neither ellipsoidal nor hyperboloidal because the axis of rotation 302, i.e. the optical axis, is neither the axis of an ellipse nor the axis of a hyperbola. Suitably, each mirror 200, 200' is manufactured using electroforming techniques, employing a suitably shaped mandrel, as is well known to persons skilled in the art.

Figure 7:
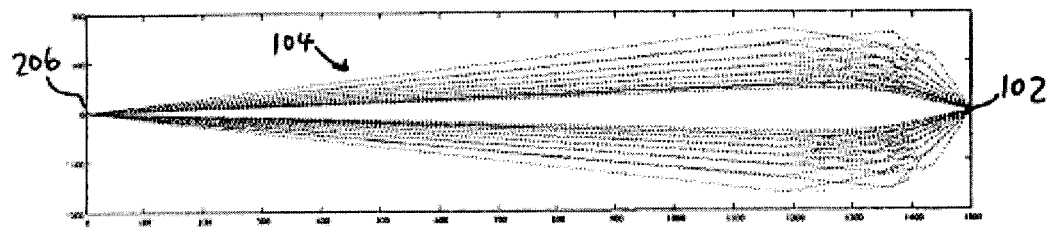
FIG. 7 illustrates a ray diagram for a collector according to an embodiment of the invention.

FIG. 7 illustrates a ray diagram for a collector 104 according to various embodiments of the invention. A nested collector 104 consists of 7 mirrors. The design is based on the same specifications as above. The corresponding design prescriptions are given in Table B.1 and Table B.2.

TABLE B.1

| | Hyperbola | | Ellipse | | Mirror radii [mm] | | |
| --- | --- | --- | --- | --- | --- | --- | --- |
| Mirror # | Conic Constant | Radius of curvature [mm] | Conic Constant | Radius of curvature [mm] | Maximum | Ellipse-hyperbola joint | Minimum |
| 1 | −1.00872112 | 2.9617 | −0.99645803 | 3.8706 | 48.5441 | 45.5219 | 31.8977 |
| 2 | −1.01382850 | 5.1834 | −0.99515149 | 5.4782 | 59.9054 | 56.5746 | 40.9869 |
| 3 | −1.02086660 | 8.2484 | −0.99291329 | 8.1715 | 73.6692 | 69.6104 | 50.5030 |
| 4 | −1.03096769 | 13.0759 | −0.98982510 | 12.0486 | 90.3490 | 85.5125 | 62.2750 |
| 5 | −1.04633222 | 21.0751 | −0.98613298 | 16.9594 | 110.2979 | 104.9712 | 77.6207 |
| 6 | −1.06768617 | 32.7047 | −0.98040519 | 24.6998 | 134.8325 | 128.5450 | 94.9206 |
| 7 | −1.10253986 | 49.8566 | −0.97060467 | 37.5569 | 166.4799 | 158.1349 | 114.2194 |

TABLE B.2

| | Position of common focus w.r.t. intermediate focus | |
| --- | --- | --- |
| Mirror # | Parallel to optical axis [mm] | Transversal to optical axis [mm] |
| 1 | 2181.5 | 30 |
| 2 | 2254 | 35.6 |
| 3 | 2297.5 | 45.4 |
| 4 | 2355.5 | 58 |
| 5 | 2428 | 69.2 |
| 6 | 2494.7 | 87.4 |
| 7 | 2515 | 111.2 |

The design of FIG. 7 collects the light from the source 102 up to an angle of 59.9°. The collection efficiency of the collector shown in FIG. 7 calculated for a point source and assuming a Ruthenium coating wherein the theoretical reflectivity is 30.2% with respect to 2π sr emission, i.e. 9% higher than the collection efficiency of the reference Wolter I collector of FIG. 4.

Figure 8:
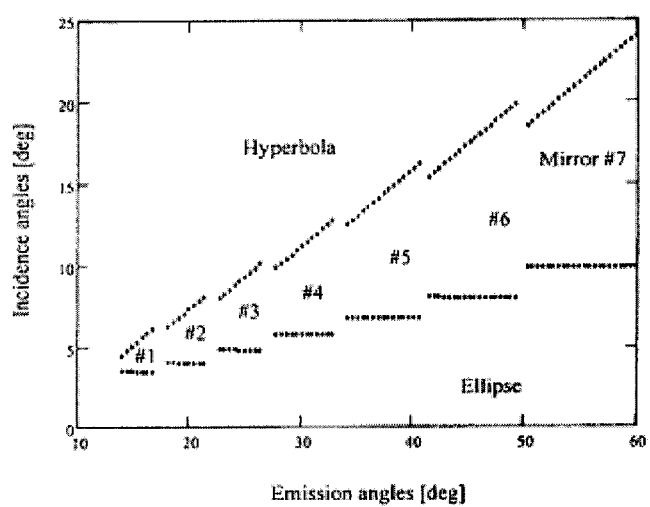
FIG. 8 shows grazing incidence angle on both the hyperbolic and elliptical sections as a function of the emission angle, for the collector of FIG. 7.

FIG. 8 shows grazing incidence angle on both the hyperbolic and elliptical sections as a function of the emission angle, for the collector of FIG. 7. It can be noted that the plots corresponding to the grazing incidence angles on the hyperbolic 202 and elliptic 204 section are still far apart from each other. Thus the main contribution to the increase of the collection efficiency with respect to the reference Wolter I design (FIG. 4) is due to the increase of the collected angle from the source 102.

Figure 9:
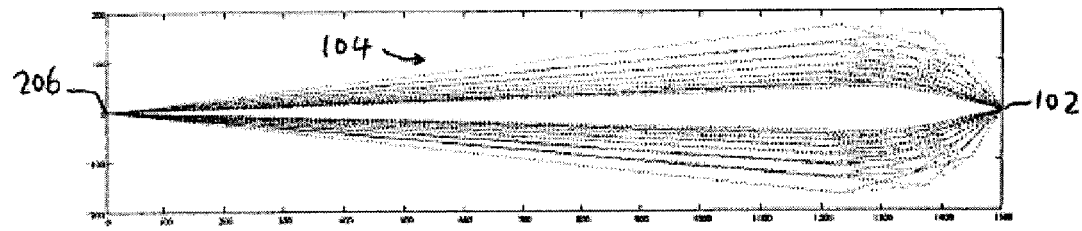
FIG. 9 illustrates a ray diagram for a collector according to another embodiment of the invention.

FIG. 9 illustrates a ray diagram for a collector 104 according to other various embodiments of the invention, consisting of 7 mirrors. The design is based on the same specifications as above. The corresponding design prescriptions are given in Table C.1 and Table C.2. In the embodiment of FIG. 9, the ends of the mirrors on the IF side (left side in figure) are not aligned at the same position along the optical axis 302. This adds further degrees of freedom to the design allowing a further improvement of the optical performance.

The design of FIG. 9 collects the light from the source 102 up to an angle of 61.8°. The collection efficiency of the collector 104 shown in FIG. 9 calculated for a point source and assuming a Ruthenium coating with theoretical reflectivity is 32.2% with respect to 2π sr emission, i.e. 16.2% higher than the collection efficiency of the reference Wolter I collector of FIGS. 4 and 6.6% higher than the collection efficiency of the first embodiment of FIGS. 7 and 8.

TABLE C.1

| | Hyperbola | | Ellipse | | Mirror radii [mm] | | |
| --- | --- | --- | --- | --- | --- | --- | --- |
| Mirror # | Conic Constant | Radius of curvature [mm] | Conic Constant | Radius of curvature [mm] | Maximum | Ellipse-hyperbola joint | Minimum |
| 1 | −1.01184308 | 3.1987 | −0.99602012 | 4.0735 | 49.3046 | 46.1980 | 33.3707 |
| 2 | −1.01757370 | 5.3379 | −0.99473215 | 5.5785 | 59.8782 | 56.3148 | 41.2989 |
| 3 | −1.02578746 | 8.2472 | −0.99237091 | 8.2217 | 72.9209 | 68.5882 | 50.3699 |
| 4 | −1.03814081 | 12.3532 | −0.98860798 | 12.3675 | 88.8310 | 83.3322 | 60.6473 |
| 5 | −1.06010381 | 18.1095 | −0.98227521 | 18.9451 | 108.7425 | 101.3410 | 72.0890 |
| 6 | −1.09432364 | 25.9728 | −0.97108282 | 30.4147 | 134.4297 | 123.9259 | 84.4673 |
| 7 | −1.15329957 | 36.8423 | −0.95037239 | 51.1674 | 169.2152 | 153.3835 | 96.9687 |

TABLE C.2

| Mirror # | Position of common focus w.r.t. intermediate focus | |
|---|---|---|
| | Parallel to optical axis [mm] | Transversal to optical axis [mm] |
| 1 | 2042.85 | 23.75 |
| 2 | 2112.15 | 28.35 |
| 3 | 2146.8 | 36.4 |
| 4 | 2158.35 | 46.75 |
| 5 | 2117.925 | 55.95 |
| 6 | 2071.725 | 70.9 |
| 7 | 2008.2 | 90.45 |

Figure 10:
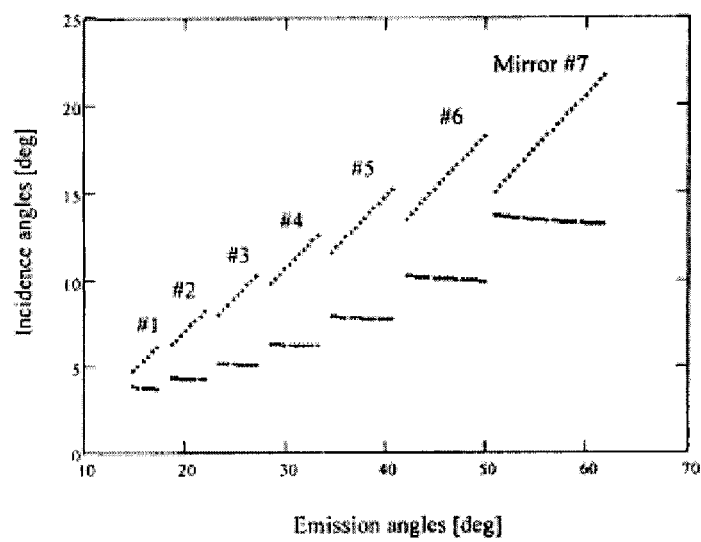
FIG. 10 shows grazing incidence angle on both the hyperbolic and elliptical sections as a function of the emission angle, for the collector of FIG. 9.

FIG. 10 shows grazing incidence angle on both the hyperbolic 202 and elliptical 204 sections as a function of the emission angle, for the collector of FIG. 9. It can be noted that the plots corresponding to the grazing incidence angles on the hyperbolic 202 and elliptic 204 section are now closer than the embodiment of FIG. 8. Thus the increase of the collection efficiency is due to both the increase of the collected angle from the source 102 and the closer values of the reflection angles on the two surfaces 202, 204.

Encompassed by various embodiments of the invention are collector optics for imaging (e.g. EUV or X-ray), and imaging systems incorporating such optics; the design of such imaging optics and imaging systems is discussed in, for example, European patent application no. 06425539.1.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. For example, the ordering of steps recited in a method need not be performed in a particular order unless explicitly stated or implicitly required (e.g., one step requires the results or a product of a previous step to be available). While the dimensions and types of materials described herein are intended to define the parameters of the invention, they are by no means limiting and are exemplary embodiments. Many other embodiments will be apparent to those of skill in the art upon reviewing and understanding the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A collector optical system in which radiation is collected from a radiation source and directed to an image focus, the collector optical system comprising:

a source focus residing along an optical axis and at which the radiation source is located;

two or more mirrors, each mirror being symmetric about the optical axis and having at least first and second reflective surfaces, wherein the first and second reflective surfaces having a common focus such that the radiation from the radiation source undergoes successive grazing incidence reflections at said first and second reflective surfaces and is focused at an intermediate focus that resides on the optical axis; and wherein the common focus is transversely offset by a predetermined distance Δr with respect to the optical axis so that an off-axis line through the intermediate focus and the common focus defines an angle α with respect to the optical axis that is in the range from about 1 milliradian (mrad) to about 100 mrad.

2. The system of claim 1, wherein said the angle α is in the range from about 10 mrad to about 45 mrad.

3. The system of claim 1, wherein each minor is formed as an electroformed monolithic component, and wherein the first and second reflective surfaces are each provided on a respective one of two contiguous sections of the mirror.

4. The system of claim 1, wherein two or more of the minors have a different geometry.

5. The system of claim 1, wherein the two or more minors are defined as follows:

| | Hyperbola | | Ellipse | | Mirror radii [mm] | | |
|---|---|---|---|---|---|---|---|
| Mirror # | Conic Constant | Radius of curvature [mm] | Conic Constant | Radius of curvature [mm] | Maximum | Ellipse-hyperbola joint | Minimum |
| 1 | −1.00872112 | 2.9617 | −0.99645803 | 3.8706 | 48.5441 | 45.5219 | 31.8977 |
| 2 | −1.01382850 | 5.1834 | −0.99515149 | 5.4782 | 59.9054 | 56.5746 | 40.9869 |
| 3 | −1.02086660 | 8.2484 | −0.99291329 | 8.1715 | 73.6692 | 69.6104 | 50.5030 |

-continued

|  | Hyperbola | | Ellipse | | Mirror radii [mm] | | |
| --- | --- | --- | --- | --- | --- | --- | --- |
| Mirror # | Conic Constant | Radius of curvature [mm] | Conic Constant | Radius of curvature [mm] | Maximum | Ellipse-hyperbola joint | Minimum |
| 4 | −1.03096769 | 13.0759 | −0.98982510 | 12.0486 | 90.3490 | 85.5125 | 62.2750 |
| 5 | −1.04633222 | 21.0751 | −0.98613298 | 16.9594 | 110.2979 | 104.9712 | 77.6207 |
| 6 | −1.06768617 | 32.7047 | −0.98040519 | 24.6998 | 134.8325 | 128.5450 | 94.9206 |
| 7 | −1.10253986 | 49.8566 | −0.97060467 | 37.5569 | 166.4799 | 158.1349 | 114.2194 |

|  | Position of common focus w.r.t. intermediate focus | |
| --- | --- | --- |
| Mirror # | Parallel to optical axis [mm] | Transversal to optical axis [mm] |
| 1 | 2181.5 | 30 |
| 2 | 2254 | 35.6 |
| 3 | 2297.5 | 45.4 |
| 4 | 2355.5 | 58 |
| 5 | 2428 | 69.2 |
| 6 | 2494.7 | 87.4 |
| 7 | 2515 | 111.2 |

6. The system of claim 1, wherein the two or more minors are defined as follows:

|  | Hyperbola | | Ellipse | | Mirror radii [mm] | | |
| --- | --- | --- | --- | --- | --- | --- | --- |
| Mirror # | Conic Constant | Radius of curvature [mm] | Conic Constant | Radius of curvature [mm] | Maximum | Ellipse-hyperbola joint | Minimum |
| 1 | −1.01184308 | 3.1987 | −0.99602012 | 4.0735 | 49.3046 | 46.1980 | 33.3707 |
| 2 | −1.01757370 | 5.3379 | −0.99473215 | 5.5785 | 59.8782 | 56.3148 | 41.2989 |
| 3 | −1.02578746 | 8.2472 | −0.99237091 | 8.2217 | 72.9209 | 68.5882 | 50.3699 |
| 4 | −1.03814081 | 12.3532 | −0.98860798 | 12.3675 | 88.8310 | 83.3322 | 60.6473 |
| 5 | −1.06010381 | 18.1095 | −0.98227521 | 18.9451 | 108.7425 | 101.3410 | 72.0890 |
| 6 | −1.09432364 | 25.9728 | −0.97108282 | 30.4147 | 134.4297 | 123.9259 | 84.4673 |
| 7 | −1.15329957 | 36.8423 | −0.95037239 | 51.1674 | 169.2152 | 153.3835 | 96.9687 |

|  | Position of common focus w.r.t. intermediate focus | |
| --- | --- | --- |
| Mirror # | Parallel to optical axis [mm] | Transversal to optical axis [mm] |
| 1 | 2042.85 | 23.75 |
| 2 | 2112.15 | 28.35 |
| 3 | 2146.8 | 36.4 |
| 4 | 2158.35 | 46.75 |
| 5 | 2117.925 | 55.95 |
| 6 | 2071.725 | 70.9 |
| 7 | 2008.2 | 90.45 |

7. The system of claim 1, wherein the radiation is one of Extreme Ultra-Violet (EUV) and x-ray radiation.

8. The system of claim 1, wherein the one or more mirrors is configured for Extreme Ultra-Violet (EUV) lithography.

9. The system of claim 1, wherein the one or more mirrors is configured for optical imaging.

10. An Extreme Ultra-Violet (EUV) lithography system comprising:

the collector optical system of claim 1
an illuminator operably arranged downstream of the collector optical system; and
a reflective mask operably arranged relative to the illuminator.

11. The EUV lithography system of claim 10, wherein the radiation source comprises a laser produced plasma (LPP) source.

12. An imaging system, comprising:

the collector optical system of claim 1;
an illuminator operably arranged downstream of the collector optical system; and
a reflective mask operably arranged relative to the illuminator; and
a projection optics box operably disposed relative to the reflective mask.

13. The imaging system of claim 12, wherein the imaging device comprises a charge-coupled device (CCD) array.

14. The imaging system of claim 12, wherein the radiation is one of Extreme Ultra-Violet (EUV) radiation and x-ray radiation.

* * * * *